(12) United States Patent
Solaro et al.

(10) Patent No.: US 10,037,988 B1
(45) Date of Patent: Jul. 31, 2018

(54) HIGH VOLTAGE PNP USING ISOLATION FOR ESD AND METHOD FOR PRODUCING THE SAME

(71) Applicant: GLOBALFOUNDRIES Singapore Pte. Ltd., Singapore (SG)

(72) Inventors: Yohann Frederic Michel Solaro, Singapore (SG); Rudy Octavius Sihombing, Singapore (SG); Tsung-Che Tsai, Singapore (SG); Chai Ean Gill, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/685,798

(22) Filed: Aug. 24, 2017

(51) Int. Cl.
*H01L 27/082* (2006.01)
*H01L 29/735* (2006.01)
(Continued)

(52) U.S. Cl.
CPC ...... *H01L 27/0262* (2013.01); *H01L 21/8222* (2013.01); *H01L 27/0259* (2013.01);
(Continued)

(58) Field of Classification Search
CPC ............... H01L 27/067; H01L 27/0783; H01L 27/0248; H01L 27/0259; H01L 27/0262; H01L 27/0292; H01L 29/0804; H01L 29/0808; H01L 29/0821; H01L 29/1008; H01L 29/41708; H01L 29/66234; H01L 29/6625; H01L 29/66325; H01L 29/66265
See application file for complete search history.

(56) References Cited

U.S. PATENT DOCUMENTS 6,072,219 A * 6/2000 Ker .................... H01L 27/0251
  257/354
7,436,043 B2 * 10/2008 Sung .................... H01L 21/761
  257/500

(Continued)

OTHER PUBLICATIONS

"Lateral PNP BJT ESD Protection Devices," V.A. Vashchenko et al., IEEE BCTM 3.3, National Semiconductor Corporation, Santa Clara, CA, 2008.*
(Continued)

*Primary Examiner* — Maliheh Malek
(74) *Attorney, Agent, or Firm* — Ditthavong & Steiner, P.C.

(57) ABSTRACT

A method of forming a HV lateral PNP BJT with a pulled back isolation structure and a polysilicon gate covering a part of the NW+HVNDDD base region and a part of the collector extension (HVPDDD) and the resulting device are provided. Embodiments include forming a DVNWELL in a portion of a p-sub; forming a HVPDDD in a portion of the DVNWELL; forming a LVPW in a portion of the HVPDDD; forming a first and a second NW laterally separated in a portion of the DVNWELL, the first and second NW being laterally separated from the HVPDDD; forming a N+ base, a P+ emitter, and a P+ collector in an upper portion of the first and second NW and LVPW, respectively; forming a STI structure between the P+ emitter and P+ collector in a portion of the DVNWELL, HVPDDD, and LVPW, respectively; and forming a SAB layer over the STI structure.

20 Claims, 5 Drawing Sheets

(51) Int. Cl.
  *H01L 27/02* (2006.01)
  *H01L 29/06* (2006.01)
  *H01L 27/06* (2006.01)
  *H01L 21/8222* (2006.01)
  *H02H 9/04* (2006.01)
  *H01L 27/102* (2006.01)
  *H01L 27/07* (2006.01)
  *H01L 29/66* (2006.01)

(52) U.S. Cl.
  CPC .............. *H01L 27/06* (2013.01); *H01L 29/06* (2013.01); *H01L 29/735* (2013.01); *H02H 9/046* (2013.01); *H01L 27/0248* (2013.01); *H01L 27/067* (2013.01); *H01L 27/0783* (2013.01); *H01L 29/6625* (2013.01)

(56) References Cited

U.S. PATENT DOCUMENTS

| | | | | |
|---|---|---|---|---|
| 7,808,069 | B2 * | 10/2010 | Ho | H01L 29/872 257/484 |
| 8,378,420 | B2 * | 2/2013 | Mallikarjunaswamy | H01L 21/823807 257/331 |
| 8,476,736 | B2 * | 7/2013 | Lee | H01L 27/0255 257/547 |
| 8,704,303 | B2 * | 4/2014 | Mallikarjunaswamy | H01L 21/823807 257/331 |
| 8,778,743 | B2 * | 7/2014 | Lai | H01L 29/7436 257/173 |
| 8,823,139 | B2 * | 9/2014 | Lee | H01L 27/0255 257/547 |
| 9,111,992 | B2 * | 8/2015 | Koo | H01L 29/7835 |
| 9,123,540 | B2 * | 9/2015 | Salcedo | H01L 29/7436 |
| 9,190,408 | B2 * | 11/2015 | Mallikarjunaswamy | H01L 21/823807 |
| 9,343,458 | B2 | 5/2016 | Wang | |
| 9,362,266 | B1 * | 6/2016 | Lee | H01L 27/0255 |
| 9,478,608 | B2 * | 10/2016 | Salcedo | H01L 29/0646 |
| 9,525,061 | B2 * | 12/2016 | Koo | H01L 29/7835 |
| 9,659,922 | B2 * | 5/2017 | Zhan | H01L 27/0262 |
| 9,831,232 | B2 * | 11/2017 | Hong | H01L 27/0262 |
| 2002/0081783 | A1 * | 6/2002 | Lee | H01L 27/0266 438/133 |
| 2006/0044719 | A1 * | 3/2006 | Chen | H01L 27/0255 361/56 |
| 2009/0230426 | A1 * | 9/2009 | Carpenter, Jr. | H01L 27/0255 257/173 |
| 2010/0044834 | A1 * | 2/2010 | Park | H01L 27/0259 257/572 |
| 2010/0133583 | A1 * | 6/2010 | Mawatari | H01L 27/0259 257/173 |
| 2011/0127602 | A1 * | 6/2011 | Mallikarjunaswamy | H01L 21/823807 257/331 |
| 2011/0207409 | A1 * | 8/2011 | Ker | H01L 27/0262 455/63.1 |
| 2012/0119331 | A1 * | 5/2012 | Gendron | H01L 27/0262 257/587 |
| 2013/0062691 | A1 * | 3/2013 | Koo | H01L 29/7835 257/335 |
| 2013/0187218 | A1 * | 7/2013 | Lai | H01L 27/027 257/328 |
| 2013/0187231 | A1 * | 7/2013 | Lai | H01L 29/78 257/355 |
| 2014/0001549 | A1 * | 1/2014 | Bode | H01L 29/66659 257/337 |
| 2014/0049313 | A1 * | 2/2014 | Lai | H01L 29/7436 327/530 |
| 2014/0054696 | A1 * | 2/2014 | Lai | H01L 27/027 257/339 |
| 2014/0167106 | A1 * | 6/2014 | Salcedo | H01L 29/66378 257/146 |
| 2015/0236006 | A1 * | 8/2015 | Lai | H01L 27/027 257/339 |
| 2015/0236009 | A1 * | 8/2015 | Gill | H01L 27/0259 257/491 |
| 2015/0243770 | A1 * | 8/2015 | Hebert | H01L 29/732 257/586 |
| 2015/0311338 | A1 * | 10/2015 | Koo | H01L 29/7835 257/343 |
| 2016/0300830 | A1 * | 10/2016 | Salcedo | H01L 27/0259 |
| 2017/0084603 | A1 * | 3/2017 | Huang | H01L 27/0259 |
| 2017/0221876 | A1 * | 8/2017 | Huang | H01L 27/0248 |
| 2017/0236817 | A1 * | 8/2017 | Zhan | H01L 27/0262 257/526 |
| 2018/0061950 | A1 * | 3/2018 | Hsu | H01L 29/1095 |
| 2018/0082994 | A1 * | 3/2018 | Han | H01L 27/0262 |

OTHER PUBLICATIONS

Gendron et al. "Area-Efficient, Reduced and No-Snapback PNP-based ESD Protection in Advanced Smart Power Technology", Published in Electrical Overstress/Electrostatic Discharge Symposium, 2006. EOS/ESD '06, retrieved on Aug. 22, 2017 from "http://ieeexplore.ieee.org/document/5256801/", 8 pages.

* cited by examiner

HIGH VOLTAGE PNP USING ISOLATION FOR ESD AND METHOD FOR PRODUCING THE SAME

TECHNICAL FIELD

The present disclosure relates to electrostatic discharge (ESD) protection devices. The present disclosure is particularly applicable to a high voltage (HV) lateral p-type; n-type; p-type (PNP) bipolar junction transistor (BJT).

BACKGROUND

ESD impact on production yield and product quality is increasingly becoming more significant due to requirements for higher speeds and device scaling. In general, ESD protection devices work by providing a path through the integrated circuit (IC) that has high current shunting capabilities. Known PNP-based ESD protection solutions are not always latch-up safe, for example, they may rely on a typical n-type lateral double diffused metal-oxide-semiconductor ESD field effect transistor (LDNMOS ESDFET) that shows snapback (low holding voltage ($V_H$)) outside of an ESD design window. In addition known PNP-based ESD protection solutions often require considerable device area, which can be an inefficient use of limited device area.

A need therefore exists for methodology enabling improved $V_H$ using a known or smaller ESD cell area and the resulting device.

SUMMARY

An aspect of the present disclosure is a process of forming a HV lateral PNP BJT with a pulled back isolation structure and a polysilicon gate covering a part of the n-type well (NW)+n-type high voltage double diffusion drain (HVNDDD) base region and a part of the collector extension or p-type high voltage double diffusion drain (HVPDDD).

Another aspect of the present disclosure is a HV lateral PNP BJT with a pulled back isolation structure and a polysilicon gate covering a part of the NW+HVNDDD base region and a part of the collector extension (HVPDDD).

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a dual voltage n-well (DVNWELL) region in a portion of a p-type substrate (p-sub); forming a HVPDDD region in a portion of the DVNWELL region; forming a low-voltage p-well (LVPW) in a portion of the HVPDDD region; forming a first and a second NW laterally separated in a portion of the DVNWELL region, the first and second NW being laterally separated from the HVPDDD region; forming a N+ base region, a P+ emitter region, and a P+ collector region in an upper portion of the first NW, the second NW, and the LVPW, respectively; forming a shallow trench isolation (STI) structure between the P+ emitter and P+ collector regions in a portion of the DVNWELL region, HVPDDD region, and LVPW, respectively, and a plurality of STI structures laterally separated in an upper surface of the p-sub; and forming a silicide block (SAB) layer over the STI structure, opposite sides of the SAB layer aligned with facing edges of the P+ emitter and P+ collector regions.

Aspects of the present disclosure include forming the STI structure adjacent to the P+ emitter and P+ collector regions and in a portion of the second NW. Other aspects include forming a HVNDDD region in a portion of the DVNWELL region adjacent to the HVPDDD region prior to the forming of the first and second NW, the STI structure, and the plurality of STI structures; forming the first and second NW in a portion of the HVNDDD region; and forming a polysilicon gate over a portion of the STI structure prior to the forming of the SAB layer, a side of the polysilicon gate aligned with an edge of the P+ emitter region. Further aspects include forming the STI structure a distance away from the P+ emitter region and adjacent to the P+ collector region. Another aspect includes the distance being 0.1 micrometer (μm) to 2 μm. Additional aspects include forming a HVNDDD region in a portion of the DVNWELL region adjacent to the HVPDDD region prior to the forming of the first and second NW, the STI structure, and the plurality of STI structures; forming the first and second NW in a portion of the HVNDDD region; and forming a polysilicon gate over a portion of the STI structure prior to the forming of the SAB layer, a side of the polysilicon gate aligned with an edge of the P+ emitter region. Other aspects include forming a polysilicon gate over a portion of the STI structure prior to the forming of the SAB layer, a side of the polysilicon gate aligned with an edge of the P+ emitter region. Further aspects include forming a HVNDDD region in a portion of the DVNWELL region adjacent to the HVPDDD region prior to the forming of the first and second NW, the STI structure, and the plurality of STI structures; and forming the first and second NW in a portion of the HVNDDD region. Additional aspects include forming the SAB layer with a lateral width of 1 μm to 8 μm.

Another aspect of the present disclosure is a device including: a DVNWELL region in a portion of a p-sub; a HVPDDD region in a portion of the DVNWELL region; a LVPW in a portion of the HVPDDD region; a first and a second NW being laterally separated in a portion of the DVNWELL, the first and second NW laterally separated from the HVPDDD region; a N+ base region, a P+ region, and a P+ collector region in an upper portion of the first NW, the second NW, and the LVPW, respectively; a STI structure between the P+ emitter and P+ collector regions in portions of the DVNWELL region, HVPDDD region, and LVPW, respectively, and a plurality of STI structures laterally separated in an upper surface of the p-sub; and a SAB layer over the STI structure, opposite sides of the SAB layer aligned with facing edges of the P+ emitter and P+ collector regions.

Aspects of the device include the STI structure being adjacent to the P+ emitter and P+ collector regions and in a portion of the second NW. Other aspects include a HVNDDD region in a portion of the DVNWELL region adjacent to the HVPDDD region formed prior to a formation of the first and second NW, the STI structure, and the plurality of STI structures; the first and second NW in a portion of the HVNDDD region; and a polysilicon gate over a portion of the STI structure prior to a formation of the SAB layer, a side of the polysilicon gate aligned with an edge of the P+ emitter region. Further aspects include the STI structure being a distance away from the P+ emitter region and adjacent to the P+ collector region. Another aspect includes the distance being 0.1 μm to 2 μm. Additional aspects include a HVNDDD region in a portion of the DVNWELL region adjacent to the HVPDDD region, prior to a formation of the first and second NW, the STI structure, and the plurality of the STI structures; the first and second NW in a portion of the HVNDDD region; and a polysilicon gate over a portion of the STI structure prior to a formation of the SAB layer, a side of the polysilicon gate aligned with an edge of the P+ emitter region. Other aspects include a polysilicon gate over a portion of the STI structure prior to a formation of the SAB layer, a side of the polysilicon gate aligned with an edge of the P+ emitter region. Further aspects include a HVNDDD region in a portion of the DVNWELL region adjacent to the HVPDDD region prior to a formation of the first and second NW, the STI structure, and the plurality of STI structures; and the first and second NW in a portion of the HVNDDD region. Another aspect includes the SAB layer having a lateral width of 1 µm to 8 µm. A further aspect of the present disclosure is a method including: forming a DVNWELL region in a portion of a p-sub; forming a HVNDDD region and a HVPDDD region in a portion of the DVNWELL region, the HVNDDD and HVPDDD regions being adjacent; forming a first and a second NW laterally separated in a portion of the HVNDDD region; forming a LVPW in a portion of the HVPDDD region, the LVPW being laterally separated from the first and second NW; forming a N+ base region, a P+ emitter region, and a P+ collector region in an upper portion of the first NW, the second NW, and the LVPW, respectively; forming a STI structure 0.1 µm to 2 µm away from the P+ collector region and adjacent to the P+ emitter collector region in a portion of the second NW and in a portion of the HVNDDD region, HVPDDD region, and LVPW, respectively, and a plurality of STI structures laterally separated in an upper surface of the p-sub; and forming a SAB layer over the STI structure, opposite sides of the SAB layer aligned with facing edges of the P+ emitter and P+ collector regions. Aspects of the present disclosure include forming a polysilicon gate over a portion of the second NW, HVNDDD region, HVPDDD region, and STI structure, respectively, prior to the forming of the SAB layer, a side of the polysilicon gate aligned with an edge of the P+ emitter region.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of known PNP-based ESD protection solutions with latchup risks, using only one isolation type at a time, and/or compromising limited device area attendant upon forming PNP-based ESD protection devices. The problems are solved, inter alia, by forming a HV lateral PNP BJT with a pulled back isolation structure and a polysilicon gate covering a part of the NW+HVNDDD base region and a part of the collector extension (HVPDDD).

Methodology in accordance with embodiments of the present disclosure includes forming a DVNWELL region in a portion of a p-sub. A HVPDDD region is formed in a portion of the DVNWELL region and a LVPW is formed in a portion of the HVPDDD region. A first and a second NW laterally separated are formed in a portion of the DVNWELL region, the first and second NW being laterally separated from the HVPDDD region. An N+ base region, a P+ emitter region, and a P+ collector region are formed in an upper portion of the first NW, the second NW, and the LVPW, respectively. A STI structure is formed between the P+ emitter and P+ collector regions in a portion of the DVNWELL region, HVPDDD region, and LVPW, respectively, and a plurality of laterally separated STI structures are formed in an upper surface of the p-sub; and a SAB layer is formed over the STI structure, opposite sides of the SAB layer being aligned with facing edges of the P+ emitter and P+ collector regions.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
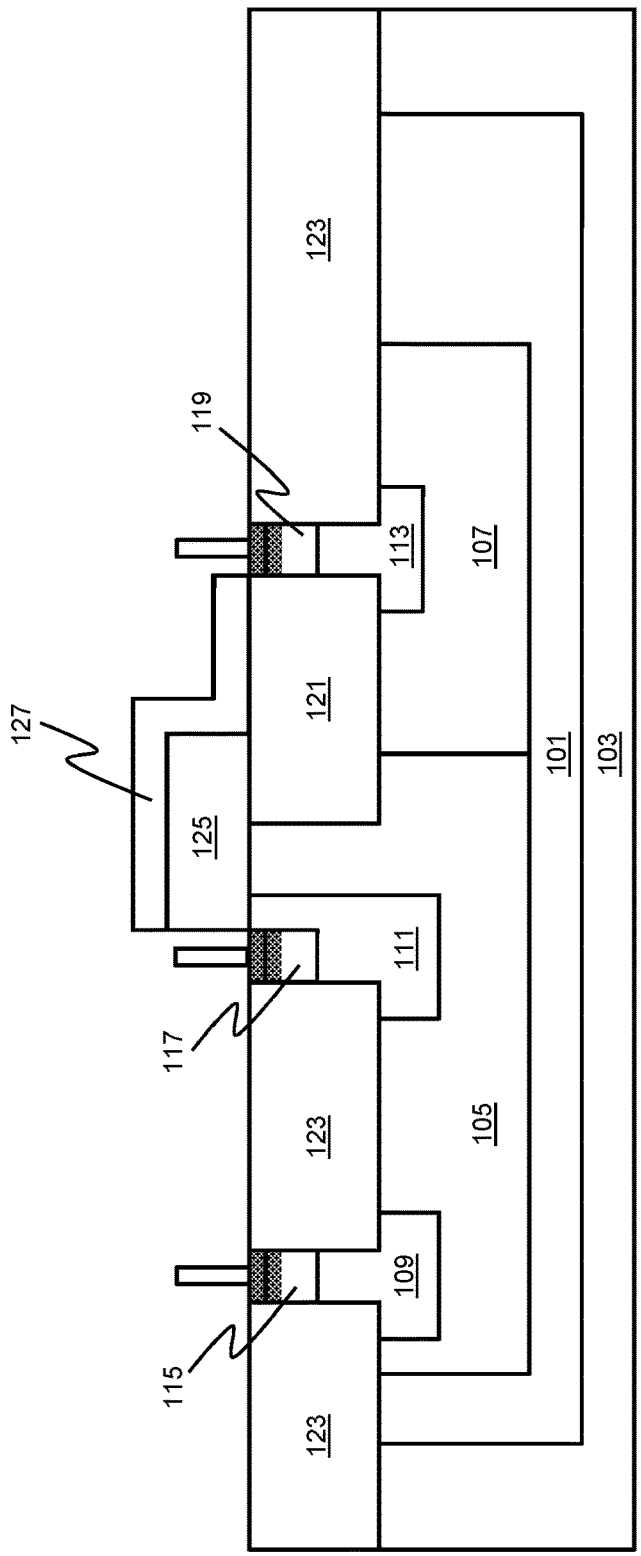
FIG. 1 schematically illustrates a cross-sectional view of a HV lateral PNP BJT with a pulled back isolation structure and a polysilicon gate covering a part of the NW+HVNDDD base region and a part of the collector extension (HVPDDD), in accordance with an exemplary embodiment.

FIG. 1 schematically illustrates a cross-sectional view of a HV lateral PNP BJT with a pulled back isolation structure and a polysilicon gate covering a part of the NW+HVNDDD base region and a part of the collector extension (HVPDDD), in accordance with an exemplary embodiment. Adverting to FIG. 1, a DVNWELL region 101 is formed in a portion of a p-sub 103. Next, a HVNDDD region 105 and a HVPDDD region 107 are formed adjacent to each other in a portion of the DVNWELL region 101. Laterally separated NW 109 and 111 are then formed in a portion of the HVNDDD region 105 and a LVPW 113 is formed in a portion of the HVPDDD region 107. Next, an N+ base region 115, a P+ emitter region 117, and a P+ collector region 119 are formed in an upper portion of the NW 109, NW 111, and LVPW 113, respectively. Thereafter, an STI structure 121 is formed between the P+ emitter region 117 and the P+ collector region 119, e.g., 0.1 µm to 2 µm away from P+ emitter region 117 and adjacent to the P+ collector region 119, in a portion of the HVNDDD region 105, HVPDDD region 107, and LVPW 113, respectively, i.e., the STI structure 121 is "pulled back" from the P+ emitter region 117. A plurality of laterally separated STI structures 123 are also formed in an upper surface of the p-sub 103. A polysilicon gate 125 is then formed over a part of the NW 111+HVNDDD 105 base region, a part of the collector extension (HVPDDD 107), and a part of the STI structure 121. Next, a SAB layer 127 is formed, e.g., with a lateral width of 1 µm to 8 µm, over the polysilicon gate 125 and STI structure 121, with opposite sides aligned over the facing edges of the P+ emitter region 117 and the P+ collector region 119.

Figure 2:
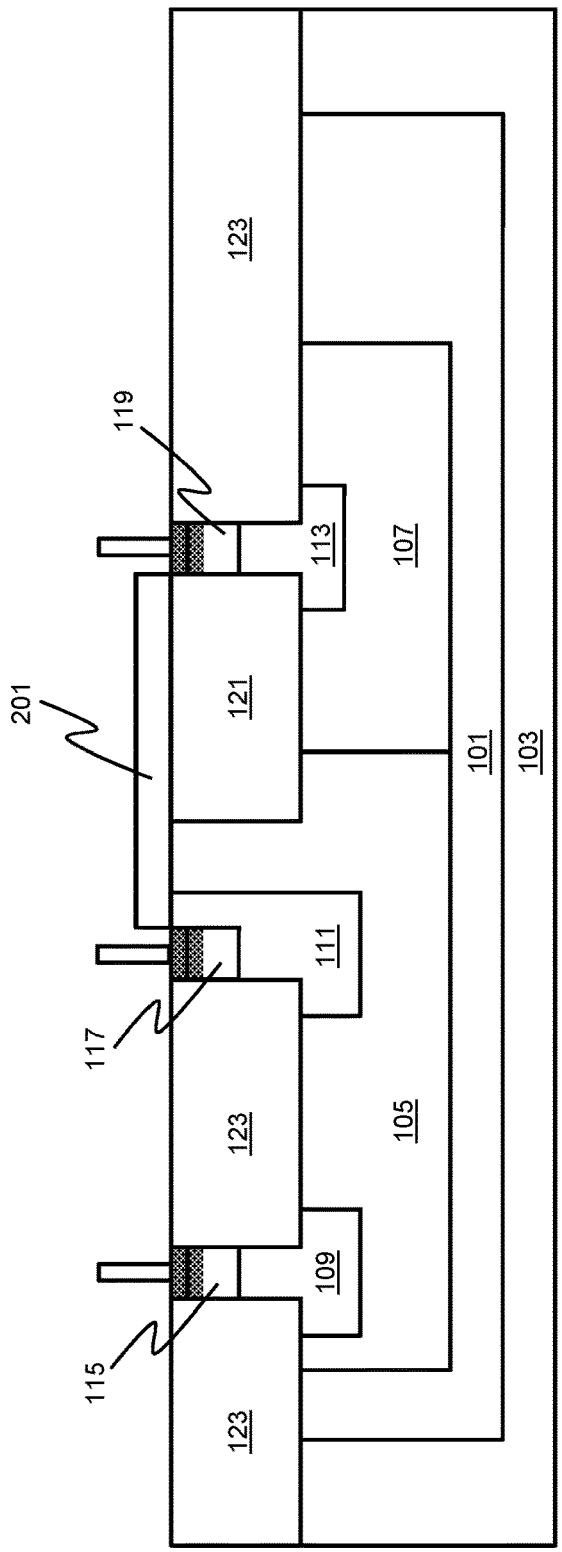
FIG. 2 schematically illustrates a cross-sectional view of a HV lateral PNP BJT with a pulled back isolation structure and a NW+HVNDDD base region, in accordance with an exemplary embodiment.

FIG. 2 schematically illustrates a cross-sectional view of a HV lateral PNP BJT with a pulled back isolation structure and a NW+HVNDDD base region, in accordance with an exemplary embodiment. The device of FIG. 2 is identical to the device of FIG. 1, except in this instance, a SAB layer 201 is formed, e.g., with a lateral width of 1 µm to 8 µm, over the NW 111, HVNDDD region 105, STI structure 121, HVPDDD region 107, and LVPW 113, between the P+ emitter region 117 and P+ collector region 119 without the formation of a polysilicon gate. Consequently, emitter-collector isolation is realized with the SAB layer 201 and STI structure 121.

Figure 3A:
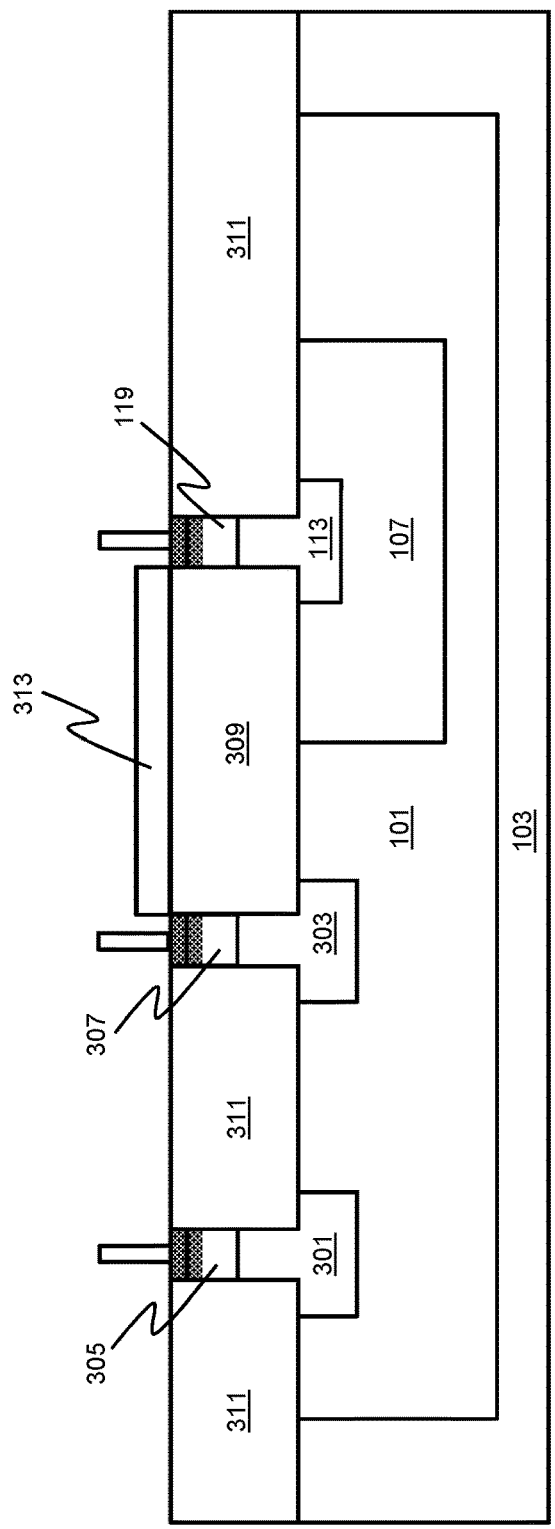
FIG. 3A schematically illustrates a cross-sectional view of a HV lateral PNP BJT with a polysilicon gate covering a part of the NW+DVNWELL base region and a part of the collector extension (HVPDDD), in accordance with an exemplary embodiment.

FIG. 3A schematically illustrates a cross-sectional view of a HV lateral PNP BJT with a polysilicon gate covering a part of the NW+DVNWELL base region and a part of the collector extension (HVPDDD), in accordance with an exemplary embodiment. The device of FIG. 3A is similar to the device of FIG. 2, except in this instance, the base region is formed only of the NW+DVNWELL and the STI region is not pulled back. Adverting to FIG. 3A, subsequent to the formation of the HVPDDD region 107 of FIG. 1, laterally separated NW 301 and 303 are formed in a portion of the DVNWELL region 101 of FIG. 1. Next, an N+ base region 305 and a P+ emitter region 307 are formed in an upper portion of the NW 301 and 303, respectively. Thereafter, an STI structure 309 is formed between and adjacent to the P+ emitter region 307 and the P+ collector region 119 of FIG. 1 in a portion of the NW 303, DVNWELL region 101, HVPDDD region 107, and LVPW 113, respectively. A plurality of laterally separated STI structures 311 are also formed in an upper surface of the p-sub 103. A SAB layer 313 is then formed, e.g., with a lateral width of 1 µm to 8 µm, over the NW 303, DVNWELL region 101, STI structure 309, HVPDDD region 107, and LVPW 113, between the P+ emitter region 307 and P+ collector region 119.

Figure 3B:
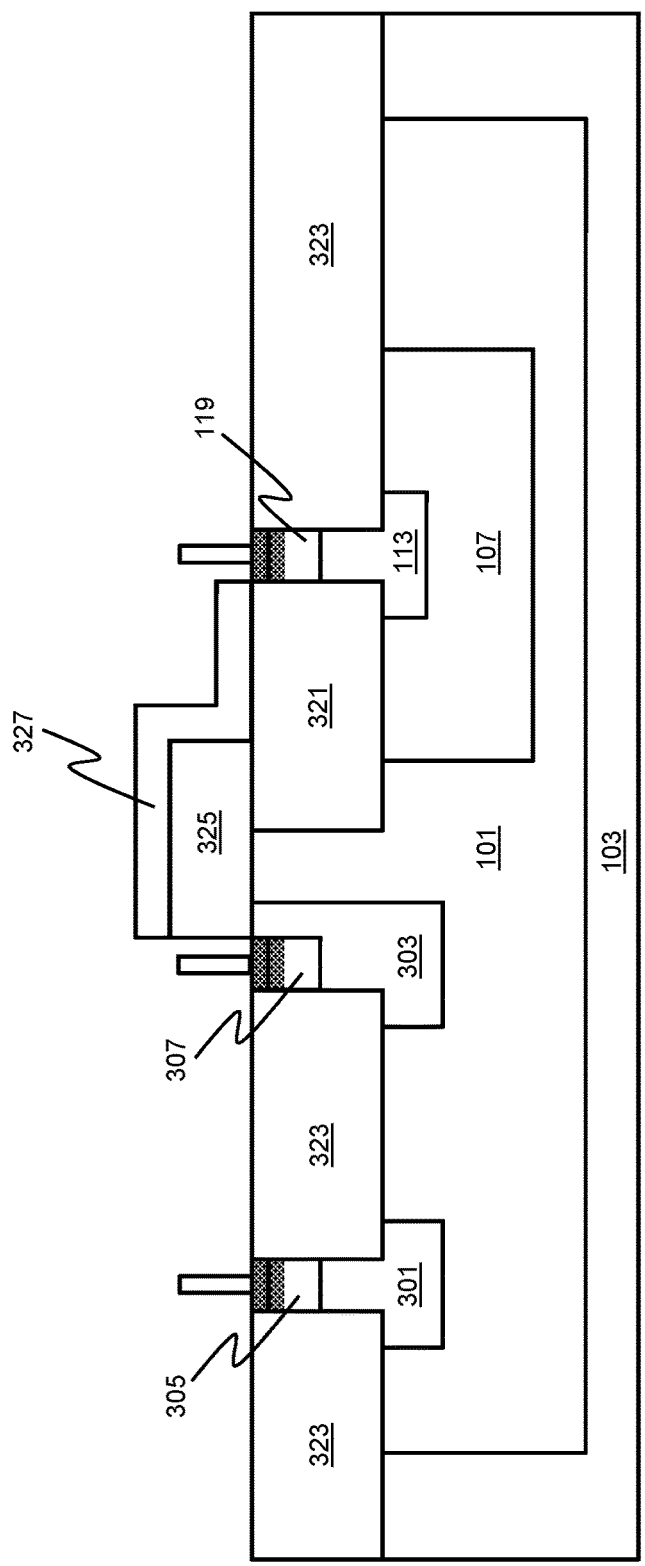
FIG. 3B schematically illustrates a cross-sectional view of a HV lateral PNP BJT with a pulled back isolation structure and a polysilicon gate covering a part of the NW+DVNWELL base region and a part of the collector extension (HVPDDD), in accordance with an exemplary embodiment.

FIG. 3B schematically illustrates a cross-sectional view of a HV lateral PNP BJT with a pulled back isolation structure and a polysilicon gate covering a part of the NW+DVN-WELL base region and a part of the collector extension (HVPDDD), in accordance with an exemplary embodiment. The device of FIG. 3B is similar to the device of FIG. 3A, except in this instance, the STI region is pulled back and a polysilicon gate is formed over a part of the base region, a part of the STI region, and a part of the collector extension. Adverting to FIG. 3B, subsequent to the formation of the N+ base region 305 and P+ emitter region 307 of FIG. 3A, an STI structure 321 is formed between the P+ emitter region 307 and the P+ collector region 119 of FIG. 1, e.g., 0.1 µm to 2 µm away from P+ emitter region 307 and adjacent to the P+ collector region 119, in a portion of the DVNWELL region 101, HVPDDD region 107, and LVPW 113, respectively. A plurality of laterally separated STI structures 323 are also formed in an upper surface of the p-sub 103. Next, a polysilicon gate 325 is formed over a part of the NW 303+DVNWELL 101 base region, a part of the collector extension (HVPDDD 107), and a part of the STI structure 321. Thereafter, a SAB layer 327 is formed, e.g., with a lateral width of 1 µm to 8 µm, over the polysilicon gate 325 and STI structure 321, with opposite sides aligned over the facing edges of the P+ emitter region 307 and the P+ collector region 119.

Figure 4:
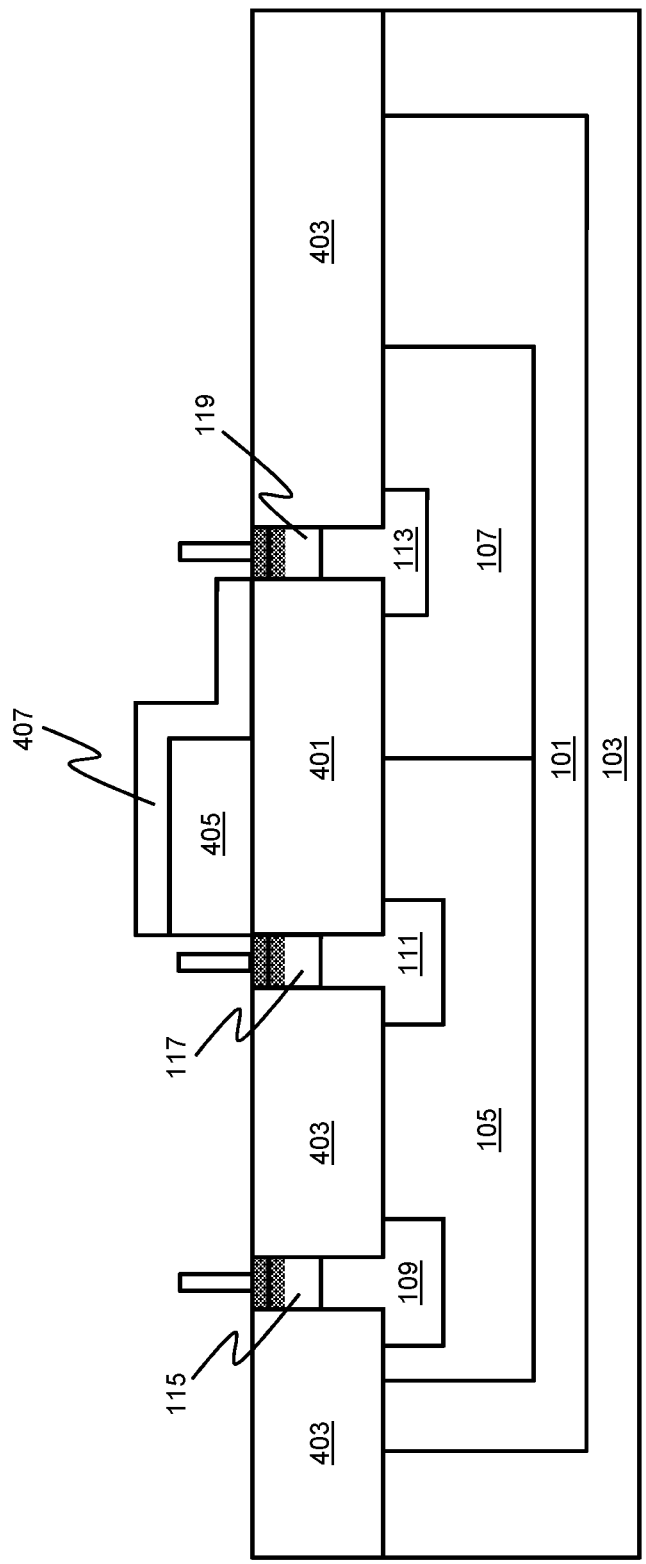
FIG. 4 schematically illustrates a cross-sectional view of a HV lateral PNP BJT with a polysilicon gate covering a part of the NW+HVNDDD base region and a part of the collector extension (HVPDDD), in accordance with an exemplary embodiment.

FIG. 4 schematically illustrates a cross-sectional view of a HV lateral PNP BJT with a polysilicon gate covering a part of the NW+HVNDDD base region and a part of the collector extension (HVPDDD), in accordance with an exemplary embodiment. The device of FIG. 4 is similar to the device of FIG. 1, except in this instance, the STI structure is not pulled back. Adverting to FIG. 4, subsequent to the formation of the N+ base, P+ emitter, and P+ collector regions 115, 117, and 119, respectively, of FIG. 1, an STI structure 401 is formed between and adjacent to the P+ emitter region 117 and the P+ collector region 119 in a portion of the NW 111, HVNDDD region 105, HVPDDD region 107, and LVPW 113, respectively. A plurality of laterally separated STI structures 403 are also formed in an upper surface of the p-sub 103. Next, a polysilicon gate 405 is formed over a part of the NW 111+HVNDDD 105 base region, a part of the collector extension (HVPDDD 107), and a part of the STI structure 401. Thereafter, a SAB layer 407 is formed, e.g., with a lateral width of 1 µm to 8 µm, over the polysilicon gate 405 and STI structure 401, with opposite sides aligned over the facing edges of the P+ emitter region 117 and the P+ collector region 119.

The embodiments of the present disclosure can achieve several technical effects including improved breakdown voltage (BV) and triggering voltage ($V_{t1}$) based on the presence of the polysilicon gate since without the polysilicon gate, the BV and $V_{t1}$ of the device are determined by junction isolation performance; lower on-resistance ($R_{ON}$) and increased threshold current ($I_{t2}$), i.e., more uniform current flow, without compromising device area with respect to the known PNP-based ESD protection solutions; functional, high holding 40-65 volt (V) ESD protection without requiring additional masks; latch-up safe, i.e., no snapback below voltage drain ($V_{DD}$), and a $V_H$ within the ESD design window. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of highly integrated semiconductor devices including a HV lateral PNP BJT.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a dual voltage n-well (DVNWELL) region in a portion of a p-type substrate (p-sub);
    forming a p-type high voltage double diffusion drain (HVPDDD) region in a portion of the DVNWELL region;
    forming a low-voltage p-well (LVPW) region in a portion of the HVPDDD region;
    forming a first and a second n-well (NW) laterally separated in a portion of the DVNWELL, the first and second NW being laterally separated from the HVPDDD region;
    forming a N+ base region, a P+ emitter region, and a P+ collector region in an upper portion of the first NW, the second NW, and the LVPW, respectively;
    forming a shallow trench isolation (STI) structure between the P+ emitter and P+ collector regions in a portion of the DVNWELL region, HVPDDD region, and LVPW, respectively, and a plurality of STI structures laterally separated in an upper surface of the p-sub; and
    forming a silicide block (SAB) layer over the STI structure, opposite sides of the SAB layer aligned with facing edges of the P+ emitter and P+ collector regions.

2. The method according to claim 1, comprising forming the STI structure adjacent to the P+ emitter and P+ collector regions and in a portion of the second NW.

3. The method according to claim 2, further comprising:
    forming a n-type high voltage double diffusion drain (HVNDDD) region in a portion of the DVNWELL region adjacent to the HVPDDD region prior to the forming of the first and second NW, the STI structure, and the plurality of STI structures;
    forming the first and second NW in a portion of the HVNDDD region; and
    forming a polysilicon gate over a portion of the STI structure prior to the forming of the SAB layer, a side of the polysilicon gate aligned with an edge of the P+ emitter region.

4. The method according to claim 1, comprising forming the STI structure a distance away from the P+ emitter region and adjacent to the P+ collector region.

5. The method according to claim 4, wherein the distance comprises 0.1 micrometer (μm) to 2 μm.

6. The method according to claim 4, further comprising:
    forming a HVNDDD region in a portion of the DVNWELL region adjacent to the HVPDDD region prior to the forming of the first and second NW, the STI structure, and the plurality of STI structures;
    forming the first and second NW in a portion of the HVNDDD region; and
    forming a polysilicon gate over a portion of the STI structure prior to the forming of the SAB layer, a side of the polysilicon gate aligned with an edge of the P+ emitter region.

7. The method according to claim 4, further comprising:
    forming a polysilicon gate over a portion of the STI structure prior to the forming of the SAB layer, a side of the polysilicon gate aligned with an edge of the P+ emitter region.

8. The method according to claim 4, further comprising:
    forming a HVNDDD region in a portion of the DVNWELL region adjacent to the HVPDDD region prior to the forming of the first and second NW, the STI structure, and the plurality of STI structures; and
    forming the first and second NW in a portion of the HVNDDD region.

9. The method according to claim 1, comprising forming the SAB layer with a lateral width of 1 μm to 8 μm.

10. A device comprising:
    a dual voltage n-well (DVNWELL) region in a portion of a p-type substrate (p-sub);
    a p-type high voltage double diffusion drain (HVPDDD) region in a portion of the DVNWELL region;
    a low-voltage p-well (LVPW) region in a portion of the HVPDDD region;
    a first and a second n-well (NW) being laterally separated in a portion of the DVNWELL, the first and second NW laterally separated from the HVPDDD region;
    a N+ base region, a P+ region, and a P+ collector region in an upper portion of the first NW, the second NW, and the LVPW, respectively;
    a shallow trench isolation (STI) structure between the P+ emitter and P+ collector regions in a portion of the DVNWELL region, HVPDDD region, and LVPW, respectively, and a plurality of STI structures laterally separated in an upper surface of the p-sub; and
    a silicide block (SAB) layer over the STI structure, opposite sides of the SAB layer aligned with facing edges of the P+ emitter and P+ collector regions.

11. The device according to claim 10, wherein the STI structure is adjacent to the P+ emitter and P+ collector regions and in a portion of the second NW.

12. The device according to claim 11, further comprising:
    a n-type high voltage double diffusion drain (HVNDDD) region in a portion of the DVNWELL region adjacent to the HVPDDD region formed prior to a formation of the first and second NW, the STI structure, and the plurality of STI structures;
    the first and second NW in a portion of the HVNDDD region; and
    a polysilicon gate over a portion of the STI structure prior to a formation of the SAB layer, a side of the polysilicon gate aligned with an edge of the P+ emitter region.

13. The device according to claim 10, wherein the STI structure is a distance away from the P+ emitter region and adjacent to the P+ collector region.

14. The device according to claim 13, wherein the distance comprises 0.1 micrometer (μm) to 2 μm.

15. The device according to claim 13, further comprising:
    a HVNDDD region in a portion of the DVNWELL region adjacent to the HVPDDD region, prior to a formation of the first and second NW, the STI structure, and the plurality of STI structures;
    the first and second NW in a portion of the HVNDDD region; and a polysilicon gate over a portion of the STI structure prior to a formation of the SAB layer, a side of the polysilicon gate aligned with an edge of the P+ emitter region.

16. The device according to claim 13, further comprising:
a polysilicon gate over a portion of the STI structure prior to a formation of the SAB layer, a side of the polysilicon gate aligned with an edge of the P+ emitter region.

17. The device according to claim 13, further comprising:
a HVNDDD region in a portion of the DVNWELL region adjacent to the HVPDDD region prior to a formation of the first and second NW, the STI structure, and the plurality of STI structures; and
the first and second NW in a portion of the HVNDDD region.

18. The device according to claim 10, wherein the SAB layer comprises a lateral width of 1 μm to 8 μm.

19. A method comprising:
forming a dual voltage n-well (DVNWELL) region in a portion of a p-type substrate (p-sub);
forming a n-type high voltage double diffusion drain (HVNDDD) region and a p-type high voltage double diffusion drain (HVPDDD) region in a portion of the DVNWELL region, the HVNDDD and HVPDDD regions being adjacent;
forming a first and a second n-well (NW) laterally separated in a portion of the HVNDDD region;
forming a low-voltage p-well (LVPW) region in a portion of the HVPDDD region, the LVPW being laterally separated from the first and second NW;
forming a N+ base region, a P+ emitter region, and a P+ collector region in an upper portion of the first NW, the second NW, and the LVPW, respectively;
forming a shallow trench isolation (STI) structure 0.1 micrometer (μm) to 2 μm away from the P+ collector region and adjacent to the P+ emitter collector region in a portion of the HVNDDD region, HVPDDD region, and LVPW, respectively, and a plurality of STI structures laterally separated in an upper surface of the p-sub; and
forming a silicide block (SAB) layer over the STI structure, opposite sides of the SAB layer aligned with facing edges of the P+ emitter and P+ collector regions.

20. The method according to claim 19, further comprising:
forming a polysilicon gate over a portion of the second NW, HVNDDD region, HVPDDD region, and STI structure, respectively, prior to the forming of the SAB layer, a side of the polysilicon gate aligned with an edge of the P+ emitter region.

* * * * *